United States Patent
Naura

[11] Patent Number: 6,127,898
[45] Date of Patent: Oct. 3, 2000

[54] RING OSCILLATOR USING CMOS TECHNOLOGY

[75] Inventor: David Naura, Aux En Provence, France

[73] Assignee: SGS-Thomson Microelectroncs S.A., Gentilly, France

[21] Appl. No.: 09/005,722

[22] Filed: Jan. 12, 1998

[30] Foreign Application Priority Data

Jan. 13, 1997 [FR] France ................................. 97 00257

[51] Int. Cl.[7] .......................... H03K 19/094; H03K 3/356
[52] U.S. Cl. ............................. 331/57; 331/175; 326/31; 326/34; 327/205; 327/206; 327/264
[58] Field of Search ....................... 331/57, 175; 326/31, 326/33, 34; 327/205, 206, 262, 264

[56] References Cited

U.S. PATENT DOCUMENTS 5,250,914  10/1993  Kondo ..................................... 331/111

FOREIGN PATENT DOCUMENTS 357067331  4/1982  Japan ....................................... 326/33

OTHER PUBLICATIONS

French Search Report from French Patent Application No. 94 00257, filed Jan. 13, 1997.

Ramirez–Angulo J.: "A Compact Current Controlled CMOS Waveform Generator" IEEE Transactions on Circuits and Systems II: Analog and Digital Signal Processing, vol. 39, No. 12, Dec. 1, 1992, pp. 883–885.

Dokic: "CMOS Schmitt Triggers" IEE Proceedings G., Electronic Circuits & Systems, vol. 131, No. 5, Oct. 1984, Stevenage, GB, pp. 197–202.

*Primary Examiner*—Arnold Kinkead
*Attorney, Agent, or Firm*—Wolf, Greenfield & Sacks, P.C.; James H. Morris; Theodore E. Galanthay

[57] ABSTRACT

A ring oscillator using CMOS technology having three logic gates, including a threshold amplifier, where the transistors that set the voltage rise threshold and the voltage drop threshold in the amplifier are controlled by a bias control circuit so that the ratio of voltage rise threshold to the voltage supply diminishes and the ratio of the voltage drop threshold to the voltage supply increases, when the supply voltage falls.

17 Claims, 4 Drawing Sheets

RING OSCILLATOR USING CMOS TECHNOLOGY

BACKGROUND OF THE INVENTION

1. Field of the Invention

The invention relates to a ring oscillator using CMOS technology for the production of a clock signal in an integrated circuit.

2. Discussion of the Related Art

A ring oscillator consists of a loop comprising an odd number of logic gates. To minimize the influence of the supply voltage on the frequency, it is habitual to use only three logic gates 1, 2, 3 as shown in FIG. 1. The invention relates more particularly to a ring oscillator using CMOS technology of the type comprising a threshold amplifier as the logic gate 2 having, at an input, a delay circuit 4 with a resistor R and a capacitor C. The other logic gates 1 and 3 are inverters. These inverter logic gates may also very well fulfill combinational function. For example, the logic gate 1 could be a NOR gate receiving, at an additional input, an on/off control signal for the oscillator.

In an oscillator of the type shown in FIG. 1, the use of a threshold amplifier enables the more efficient control of the oscillation frequency and the reduction of this frequency. The threshold amplifier makes it possible to reduce the influence of the time of propagation in the logic gate. It also makes it possible to immunize the oscillator to noise and reduce the effects of variations in the supply voltage.

Indeed, by sizing the resistor and the capacitor of circuit 4 appropriately so that the time constant RC is far greater than the time of propagation in the logic gates, the oscillation period of the oscillator may be approximated by the following formula:

$$T = 2 \cdot Req \cdot C \cdot \ln[1 - (Vb/Vdd)/1 - (Vh/Vdd)]$$

where:

Vdd is the level of the supply voltage,

Vb is the tripping threshold, at a drop in voltage, of the threshold amplifier,

Vh is the tripping threshold, at a rise in voltage, of the threshold amplifier, greater than Vb, and Req is the equivalent resistance of the delay circuit taking account of the values of input resistance RON of the transistors series-connected with the resistor R.

The present trend is towards reducing the level of the supply voltage Vdd. The integrated circuits and therefore the oscillators must be capable of working in a broadened range of voltage going for example from less than two volts to five or six volts. The oscillation frequency must be stable in this range.

In certain electronic circuits such as load pump devices used to produce high voltages capable of supplying capacitive loads (memories), it is even sought to have a clock oscillation frequency that is higher when the supply voltage diminishes.

Now, at a low supply voltage (of 3 volts or less), the propagation times in the logic gates 1 to 3 are no longer negligible as compared with the time constant RC. Indeed, at low voltage, the transistors are slower to switch over and their input resistance RON increases. As an order of magnitude, it may be said that RON is multiplied by five when Vdd goes from five to two volts. There is then, at low voltage, an equivalent resistance Req in the delay circuit that is higher owing to the increase in the values of resistance of the resistors RON series-connected with the resistor R. The time constant equal to Req.C is increased and therefore the oscillation frequency diminishes.

Thus, the oscillation frequency tends to diminish with the supply voltage and the ring oscillator therefore is not stable in a wide range of voltage.

SUMMARY OF THE INVENTION

An object of the invention is a ring oscillator made by CMOS technology using a threshold amplifier with an oscillation frequency that is stable in a wide range of voltages or even with an oscillation frequency that tends to be higher at low supply voltage.

Now, the oscillation frequency depends on the threshold amplifier tripping threshold Vh at a rise in voltage or its tripping threshold Vb at a drop in voltage as can be seen in the formula recalled here above.

In the invention, it has been sought to obtain a means of acting on these thresholds so that they approach each other when the supply voltage drops, to compensate at least for the variation of the time constant Req.C, and even a little more in order to have a higher frequency at low supply voltage.

The means of the invention has the effect of raising the ratio Vb/Vdd of the threshold at a drop in voltage (or voltage drop threshold) to the level Vdd of the supply voltage and of reducing the ratio Vd/Vdd of the threshold at a rise in voltage (or voltage rise threshold) to the level Vdd of the supply voltage when this level Vdd diminishes. In this way, the difference Vh-Vb gets reduced when the supply voltage falls. The means of the invention used to obtain this effect act on the control of the gates of the transistors that set these thresholds Vb and Vh.

The invention therefore relates to a ring oscillator made by CMOS technology comprising a first inverter logic gate, a threshold amplifier and a second inverter logic gate that are looped, a delay circuit with series-connected resistor and parallel-connected capacitor being placed at input of the threshold amplifier, this threshold amplifier comprising an inverter stage with an upper arm with P MOS transistors and a lower arm with N MOS transistors and a stage to fix the voltage rise threshold and voltage drop threshold of the input voltage of the amplifier comprising a first P type MOS transistor connected between the ground and a midpoint of the upper arm to set the voltage drop threshold and a second N type MOS transistor connected between the supply voltage and a midpoint of the lower arm to set the voltage rise threshold, wherein said oscillator further comprises means to control the bias of the gate of said first and second transistors so that the ratio of the voltage drop threshold to the level Vdd of the supply voltage increases and the ratio of the voltage rise threshold to the level Vdd of the supply voltage diminishes when this level Vdd falls.

BRIEF DESCRIPTION OF THE DRAWINGS

Other features and advantages of the invention are described in detail in the following description given by way of a non-exhaustive indication, with reference to the appended drawings, of which.

DETAILED DESCRIPTION

Figure 1:
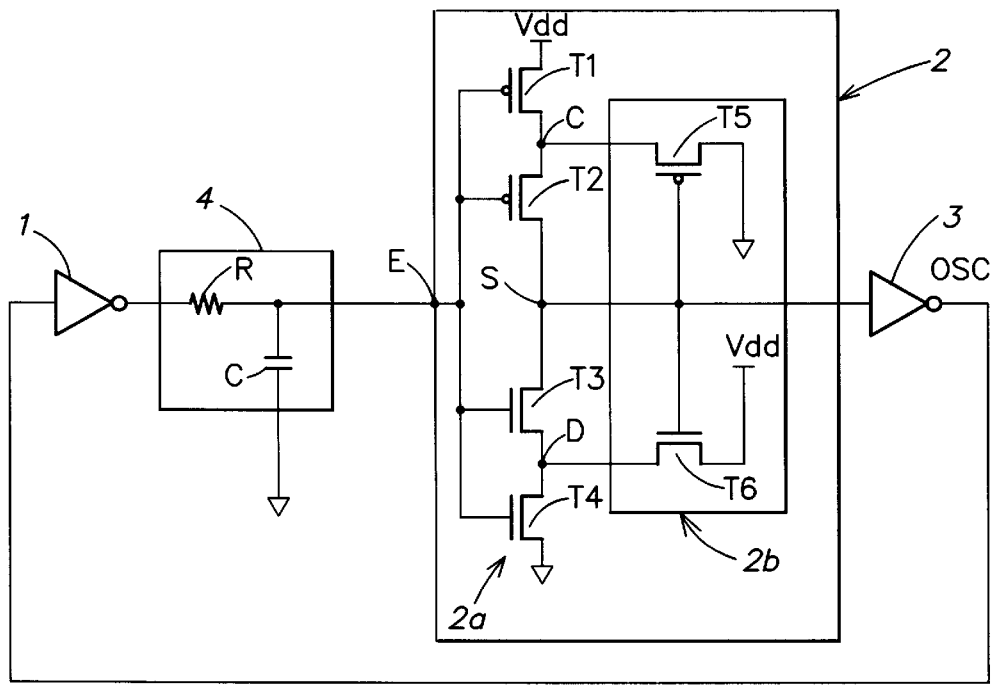
FIG. 1 shows a ring oscillator with a threshold amplifier according to the prior art.

FIG. 1 shows a prior art ring oscillator with an inverter 1, a threshold 2 and an inverter 3 that are looped. A delay circuit 4 with a series resistor R and a parallel capacitor C are placed at the input of the threshold amplifier 2.

This threshold amplifier 2 includes an inverter stage 2a and a stage 2b for setting the voltage rise threshold Vh and the voltage drop threshold Vb.

The inverter stage 2a, in an upper arm, has two P type MOS transistors T1 and T2 series-connected between the supply voltage and the output node S of the inverter stage. In a lower arm, two N type MOS transistors T3 and T4 are series-connected between the output node S and the inverter stage and the ground Vss. The gates of these four transistors are connected together and form the input E of the inverter stage.

The stage 2b for setting the thresholds Vh and Vb includes two MOS transistors. A first P type MOS transistor T5 is connected between the midpoint C of the upper arm of the inverter stage and the ground Vss. The term "midpoint" is understood to mean the point of connection between the two transistors of the arm. The gate of the transistor T5 is controlled by the output S of the inverter stage. A second N type MOS transistor T6 is connected between the midpoint D of the lower arm of the inverter stage and the supply voltage Vdd. Its gate is controlled by the output S of the inverter stage.

The input E and the output S of the inverter stage are also the input and output of the threshold amplifier. The operation of an amplifier of this kind is well known. It may simply be recalled that the transistor T5 sets the voltage drop threshold Vb of the input voltage E of the amplifier by delaying the switch-over of the upper arm of the inverter stage. In practice, when the output S of the inverter stage is at zero, the transistor T5 dictates a minimum voltage in the range of the threshold voltage of a P type transistor Vtp on the node C. When the voltage VE on the gate of the transistor T1 is low enough (<Vb), the transistor T1 succeeds in causing the voltage at the node C to rise again, making the transistor T2 conductive: the arm switches over. The voltage drop threshold Vb is set by the geometrical ratios W/L of the transistors T1 and T5.

When the output S of the inverter stage is at one, the transistor T5 is off.

The transistor T6 sets the voltage rise threshold Vh of the input voltage VE, by delaying the switch-over of the lower arm of the inverter stage. In practice, when the output S of the inverter stage is at one, the transistor T6 switches over to a maximum voltage of about Vdd-Vtn (Vtn being the threshold voltage of an N type transistor) at the node D. When the supply voltage Ve at the transistor gate T4 becomes high enough (>Vh), the transistor T4 manages to lower the voltage at the node D, making the transistor T3 conductive: the arm switches over. The rising voltage threshold Vh is set by the geometrical ratios W/L of the transistors T4 and T6.

When the output S is at zero, the transistor T6 is off.

Figure 2:
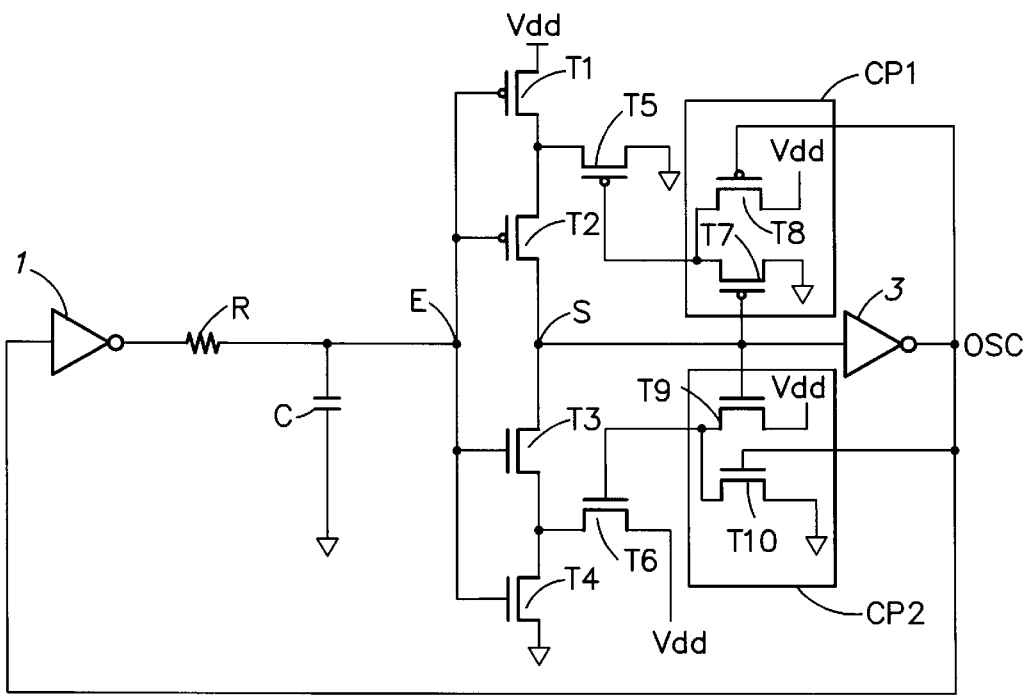
FIG. 2 shows a ring oscillator according to the invention with control means used to bring the voltage rise threshold and the voltage drop threshold closer to each other when the supply voltage diminishes.

FIG. 2 shows a ring oscillator according to the invention. In addition to the elements already described with reference to FIG. 1, it comprises means to control the bias of the gates of the transistors T5 and T6 of the threshold setting stage.

These control means are used to increase the ratio of the switch-over threshold Vb to the supply voltage level Vdd, when the Vdd level falls, so that the upper arm of the inverter switches over more quickly at the low supply voltage.

These control means also enable the ratio of the switch-over threshold Vh to the supply voltage level Vdd to be reduced when the Vdd level falls, so that the lower arm of the inverter switches over more quickly at the low supply voltage.

Figure 6:
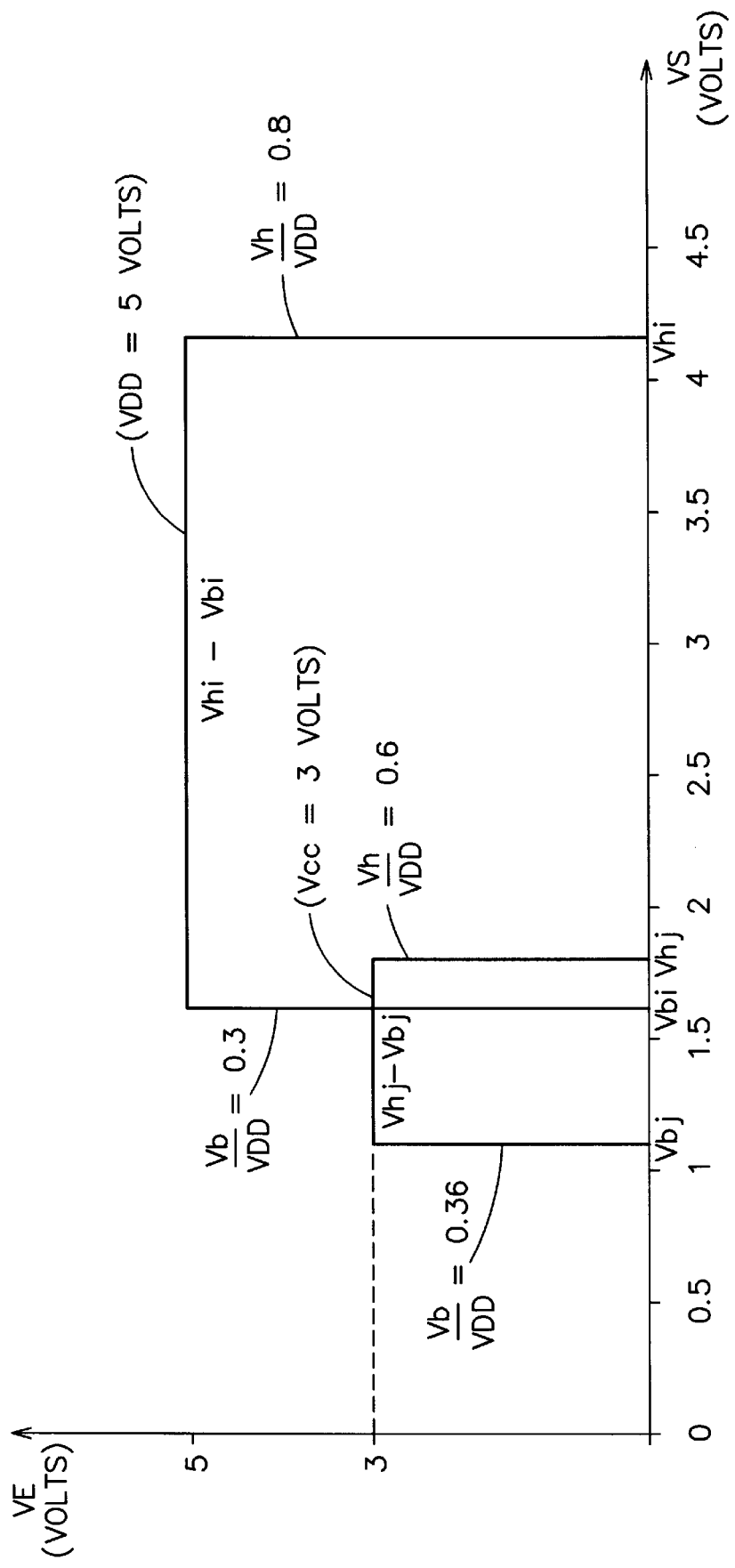
FIG. 6 shows the development of the hysteresis of the amplifier as a function of the level of Vdd in an oscillator according to the invention.

If Vbi and Vhi denote the values of the thresholds for a high level (5 volts) of the supply voltage and Vbj and Vhj denote the values of the thresholds for a low level (2 to 3 volts) of the supply voltage, hysteresis curves of the threshold amplifier 2 are obtained between a high level (5 volts) and a low level (3 volts) of the supply voltage Vdd shown in FIG. 6. This figure clearly shows that the difference Vh-Vb diminishes when Vdd diminishes.

An embodiment of the control means according to the invention is shown in FIG. 2. These control means include a first bias control circuit CP1 associated with a transistor T5 and a second bias control circuit CP2 associated with a transistor T6.

The circuit CP1 comprises a first P type MOS transistor T7 connected between the ground Vss and the gate of the transistor T5 and a second P type MOS transistor T8, connected between the supply voltage Vdd and the gate of the transistor T5. The gate of the first transistor T7 is connected to the output S of the inverter stage. The gate of the second transistor T8 is connected to the output OSC of the inverter logic gate 3 which follows the threshold amplifier.

When the output S is at zero, the output OSC is at one, the first transistor T7 is on and the second transistor T8 is off. It is therefore the transistor T7 that controls the gate of the transistor T5, in switching over, at this gate, to a voltage that is at least the threshold voltage Vtp of a P type transistor. The transistor T5 is then biased by a voltage that is independent of the supply voltage. The threshold Vtp is indeed a constant related to the technology and for example equal to 1 volt for a given CMOS technology.

If the supply voltage diminishes, since Vtp is fixed, the level of the supply voltage Vdd approaches the level of the gate voltage of the transistor T5. At low Vdd, there is then the gate voltage of the order of Vdd. This reduces the conductance of the transistor T5 with respect to the conductance of the transistor T1. In this way, the ratio Vb/Vdd is reduced and the upper arm switches over more swiftly.

When the output S is at one, the output OSC is at zero. The transistor T7 is off and the transistor T8 is on, thus making it possible not to leave the gate of the transistor T5 in a floating state: the transistor T8 imposes Vdd on the gate of transistor T5, thus turning the transistor T5 off. When the output S is at one, there is therefore the same operation as in the prior art.

The circuit CP2 comprises a first N type MOS transistor T9 connected between the supply voltage Vdd and the gate of the transistor T6 and a second N type MOS transistor T10 connected between the ground and the gate of the transistor T6. The gate of the first transistor T9 is connected to the output S of the inverter stage. The gate of the second transistor T10 is connected to the output OSC of the inverter logic gate 3.

When the output S is at zero, the output OSC is at one. The first transistor T9 is on and the second transistor T10 is off. There is then a switch-over to a voltage with a level Vdd-Vtn at the gate of the transistor T6. Vtn is the threshold voltage of the N type transistor. It is a constant fixed by the technology. It is for example 0.8 volts for a given CMOS technology.

The transistor T6 is therefore biased by a Vdd type gate voltage that is constant. If the supply voltage Vdd is diminished, the gate voltage approaches zero volts (Vss). Then the conductance of the transistor T6 becomes lower than that of the transistor T4: the ratio Vb/vdd is thus diminished, and the lower arm switches over more rapidly.

However, the embodiment of the bias control means described with reference to FIG. 2 has a number of drawbacks.

The characteristics Vtp and Vtn vary with the method of manufacture. That is, for a given technology, there is a range of values [Vtmin, Vtmax] for each of these characteristics Vtn, Vtp. These characteristics also vary with the temperature.

Furthermore, the node C is biased at 2.Vtp (2 volts) by the transistors T5, T7 and the node D is biased at Vdd-2Vtn (Vdd-1.6 volts) by the transistors T6, T9. The amplifier is therefore inoperative at low Vdd for Vdd below 2.Vtp (the upper arm cannot be conductive) or 2.Vtn (the lower arm cannot be conductive).

Figure 3:
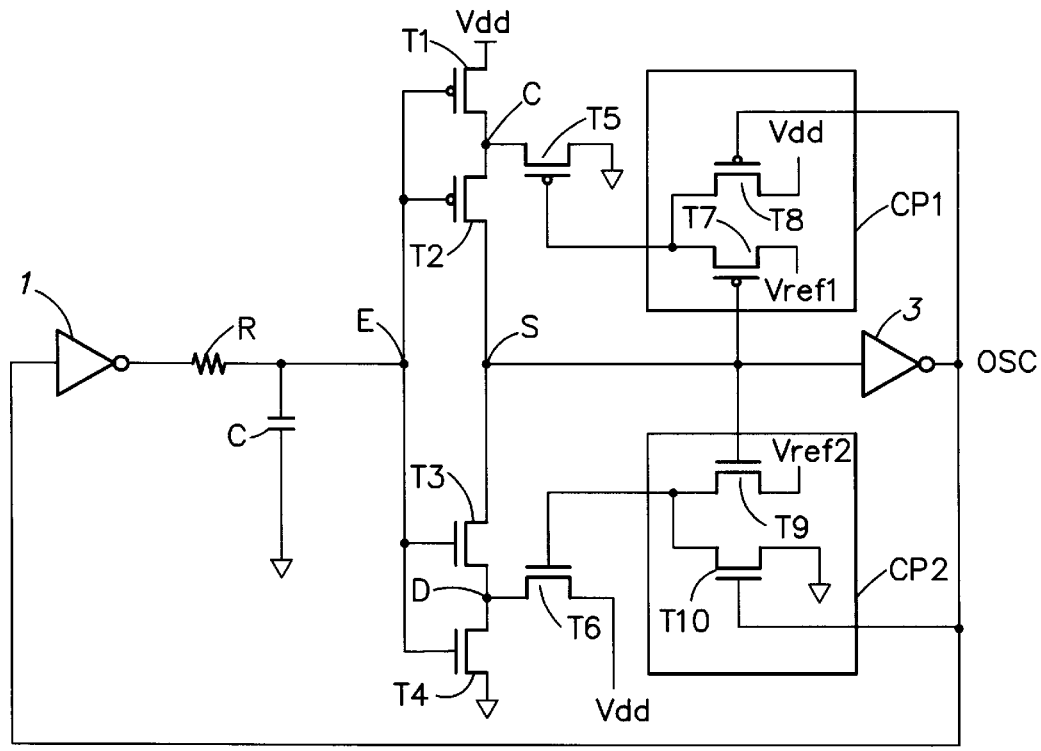
FIG. 3 shows another alternative embodiment of the oscillator.

A first variant of the embodiment of the invention is shown in FIG. 3 where it has an operation independent of the method of manufacture. It includes using stable voltage sources to bias the drains of the transistors T7 and T9. Thus, a voltage source Vref1 is used to bias the drain of the transistor T7. Vref1 is a stable voltage that is independent of the method of manufacture. It is about one volt and may be given for example by a voltage generator as described in the application FR 95 09023 incorporated herein by reference.

To bias the drain of the transistor T5, a stable voltage Vref2 is used. This voltage Vref2 is independent of the method and equal to Vdd minus a constant. This voltage Vref2 may, for example, be produced from the voltage source Vref1.

Figure 4:
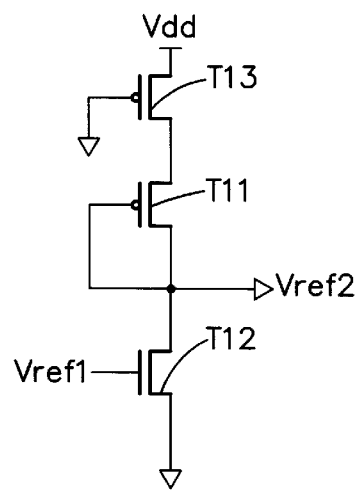
FIG. 4 shows a voltage source circuit that can be used in the invention.

An exemplary embodiment of a voltage generator Vref2 made from the voltage source Vref1 is shown in FIG. 4. This voltage generator has a P type MOS transistor T11 diode-connected with its gate connected to its drain and biased by an N type MOS transistor T12 that is connected between the drain of the transistor T11 and the ground. The transistor T12 is controlled at its gate by the voltage Vref1. In the example, another P type MOS transistor T13 is provided. This transistor T13 is mounted so as to be always on, with its gate connected to the ground, and is placed between the supply voltage and the source of the transistor T11. A voltage Vref2, substantially equal to Vdd Vref1, is then found at the drain of the transistor T11. This voltage Vref2 is less stable than the voltage Vref1, but it is sufficiently stable to be used in the invention.

However, this variant is still limited to low Vdd, even more so than in the configuration of FIG. 2, for the transistors T5 and T7 switch over to the level Vref1+2.Vtp at the node C and the transistors T6 and T9 switch over to the level Vref2+2.Vtn, namely Vdd-Vref1+2.Vtn, at the node D.

Figure 5:
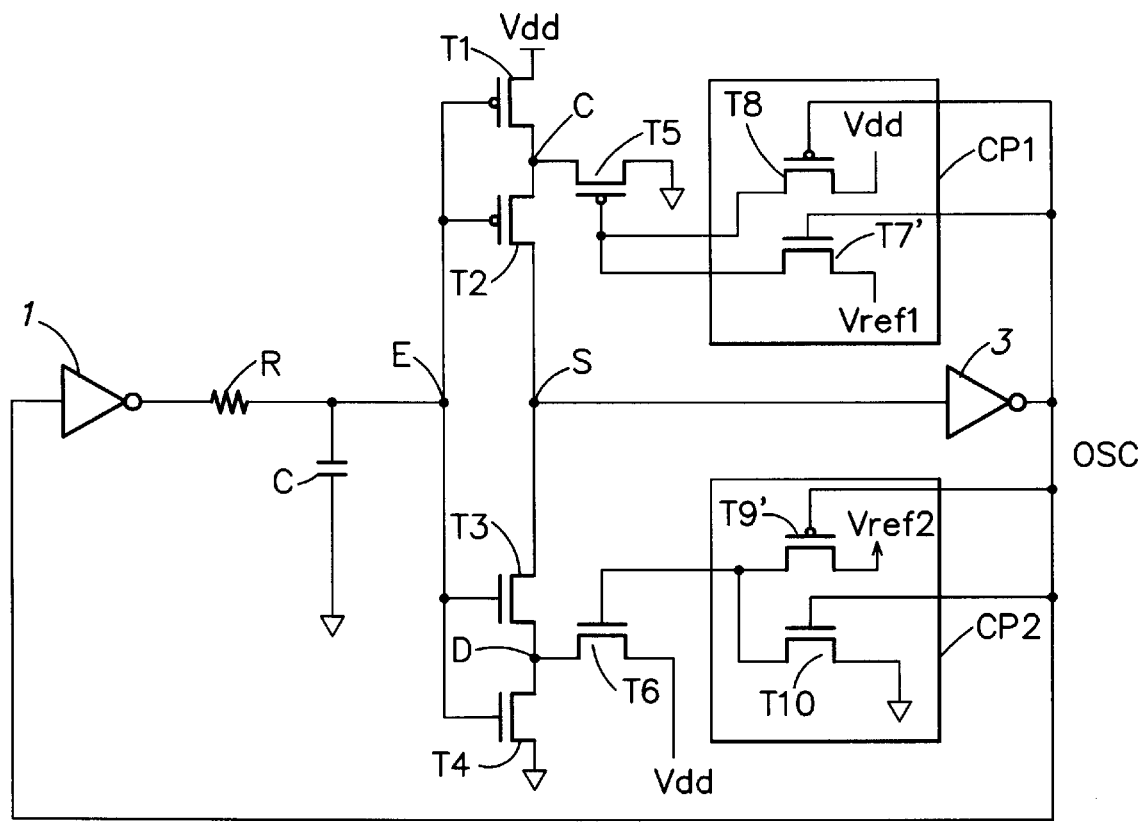
FIG. 5 shows another alternative embodiment of the oscillator.

Another variant of the invention is shown in FIG. 5. This variant can be used to improve the operation at low Vdd (three volts and less) by using transistors T7' and T9' of types opposite to the transistors 17 and T9, controlled at their gate by the output OSC. There is then a no-loss switch-over to the voltage levels Vref1 and Vref2 at the gates of the transistors T5 and T6. A transistor threshold is gained for the voltage levels to which there is a switch-over at the nodes C and D.

By combining this variant with that of FIGS. 3 and 4, the voltage level Vref1+Vtp is then found at the node C with the transistors T5 and T7' and the voltage level Vref2+Vtn is found at the node D with the transistors T6 and T9'.

In the practical example using the circuit of FIG. 3, with a voltage source Vref1 as described in the French patent application mentioned here above and a voltage source Vref2 produced according to the diagram of FIG. 4, it has thus been possible to obtain a frequency of 7.7 MHz at Vdd=5 volts, 12.3 MHz at Vdd=3 volts and 8.55 MHz at Vdd=2 volts. With a more stable voltage source Vref2 and/or the variant of FIG. 5, a better result would have been obtained with 2 volts.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A ring oscillator having CMOS technology, comprising:
   a first inverter logic gate;
   a delay circuit having a resistor series-connected to an output of the first inverter logic gate and a capacitor parallel-connected to the output of the first inverter logic gate;
   a threshold amplifier coupled to a node formed by the resistor and capacitor of the delay circuit, the threshold amplifier comprising,
      an inverter stage comprising an upper arm having P MOS transistors and a lower arm having N MOS transistors, an output of the inverter stage, is defined by a midpoint between the two arms,
      a threshold fixing stage fixing a voltage rise threshold and a voltage drop threshold of an input voltage to the threshold amplifier comprising,
         a first P type MOS transistor connected between a ground and a midpoint of the upper arm, setting the voltage drop threshold, and
         a second N type MOS transistor connected between a supply voltage and a midpoint of the lower arm, setting the voltage rise threshold, and
      means for controlling a bias of each gate of said first P type and second N type MOS transistors, resulting in an increased ratio of the voltage drop threshold to a level of the supply voltage and a decreased ratio of the voltage rise threshold to the level of the supply voltage when the level of the supply voltage falls; and
   a second inverter logic gate having an input connected to the output of the inverter stage, and having an output connected to an input of the first inverter logic gate.

2. A ring oscillator according to claim 1, wherein the means for controlling the bias comprise:
   a first biasing circuit for biasing the gate of said first P type MOS transistor, the first biasing circuit comprising a third P type MOS transistor connected between a ground and the gate of the first P type MOS transistor, and a fourth P type MOS transistor connected between the supply voltage and the gate of the first P type MOS transistor, and a second biasing circuit for biasing the gate of said second N type MOS transistor, the second biasing circuit comprising a fifth N type MOS transistor connected between the supply voltage and the gate of the second N type MOS transistor, and a sixth N type MOS transistor connected between the ground and the gate of the second transistor, the gates of the third and fifth transistors are controlled by the output of the inverter stage and the gates of the fourth and sixth transistors are controlled by the output of the second inverter logic gate.

3. A ring oscillator according to claim 1, wherein the means for controlling the bias comprise:

a first biasing circuit for biasing the gate of said first P type MOS transistor, the first biasing circuit comprising a third P type MOS transistor connected between a first stable voltage source and the gate of the first P type MOS transistor, and a fourth P type MOS transistor connected between the supply voltage and the gate of the first P type MOS transistor, and a second biasing circuit for biasing the gate of said second N type MOS transistor, the second biasing circuit comprising a fifth N type MOS transistor connected between a second stable voltage source and the gate of the second N type MOS transistor, and a sixth N type MOS transistor connected between the ground and the gate of the second transistor, the gates of the third and fifth transistors are controlled by the output of the inverter stage and the gates of the fourth and sixth transistors are controlled by the output of the second inverter logic gate.

4. A ring oscillator according to claim 3, wherein the second stable voltage source is produced from the first stable voltage source.

5. A ring oscillator as in claim 4, wherein the second voltage source is an output of a voltage generator comprising:

a P type MOS transistor diode-connected with its gate connected to its drain, a source of the P type MOS transistor is coupled to a power supply, and the drain provides the second stable voltage source; and a biasing N type MOS transistor connected between the drain of the P type MOS transistor and ground, a gate of the biasing N type transistor is controlled by the first stable voltage source.

6. A ring oscillator as in claim 5 further comprising an additional P type MOS transistor having a drain connected to the source of the P type MOS transistor, a gate connected to ground and a source connected to the power supply, placing the additional P type MOS transistor exclusively in a high state.

7. A ring oscillator as in claim 3 wherein the voltage at the second stable voltage source is equal to the voltage of the supply voltage minus the voltage of the first stable voltage source.

8. A ring oscillator as in claim 3, wherein the third P type transistor biases the gate of the first P type transistor with a voltage which is independent of the supply voltage.

9. A ring oscillator according to claim 1, wherein the means for controlling the bias comprise:

a first biasing circuit for biasing the gate of said first P type MOS transistor, the first biasing circuit comprising a third N type MOS transistor connected between a first stable voltage source and the gate of the first P type MOS transistor, and a fourth P type MOS transistor connected between the supply voltage and the gate of the first P type MOS transistor, and a second biasing circuit for biasing the gate of said second N type MOS transistor, the second biasing circuit comprising a fifth P type MOS transistor connected between a second stable voltage source and the gate of the second N type MOS transistor, and a sixth N type MOS transistor connected between the ground and the gate of the second transistor, the gates of the third, fourth, fifth and sixth transistors are controlled by the output of the second inverter logic gate.

10. A ring oscillator according to claim 9, wherein the second stable voltage source is produced from the first stable voltage source.

11. A ring oscillator as in claim 10, wherein the second voltage source is an output of a voltage generator comprising:

a P type MOS transistor diode-connected with its gate connected to its drain, a source of the P type MOS transistor is coupled to a power supply, and the drain provides the second stable voltage source; and a biasing N type MOS transistor connected between the drain of the P type MOS transistor and ground, a gate of the biasing N type transistor is controlled by the first stable voltage source.

12. A ring oscillator as in claim 11 further comprising an additional P type MOS transistor having a drain connected to the source of the P type MOS transistor, a gate connected to ground and a source connected to the power supply, placing the additional P type MOS transistor exclusively in a high state.

13. A ring oscillator having CMOS technology, comprising:

a first inverter logic gate;

a delay circuit coupled to the first inverter logic gate;

a threshold amplifier coupled to an output of the delay circuit, the threshold amplifier comprising, an inverter stage, a threshold fixing stage, the threshold fixing stage is coupled to an output of the inverter stage, for fixing a voltage rise threshold and a voltage drop threshold of an input voltage to the threshold amplifier, and means, connected to the threshold fixing stage, for reducing the difference between the thresholds when a supply voltage drops; and a second inverter logic gate having an input connected to an output of the inverter stage and having an output connected to an input of the first inverter logic gate;

wherein the means for reducing the difference between the thresholds increase a ratio of the voltage drop threshold to a level of the supply voltage and decrease a ratio of the voltage rise threshold to the level of the supply voltage when the level of the supply voltage falls.

14. A ring oscillator having CMOS technology, comprising:

a first inverter logic gate;

a delay circuit coupled to the first inverter logic gate;

a threshold amplifier coupled to an output of the delay circuit, the threshold amplifier comprising, an inverter stage, a threshold fixing stage, the threshold fixing stage is coupled to an output of the inverter stage, for fixing a voltage rise threshold and a voltage drop threshold of an input voltage to the threshold amplifier, and means, connected to the threshold fixing stage, for reducing the difference between the thresholds when a supply voltage drops; and a second inverter logic gate having an input connected to an output of the inverter stage and having an output connected to an input of the first inverter logic gate;

wherein the inverter comprises an upper arm and a lower arm, and the means for reducing the difference between the thresholds actuates the inverter to switch over from one arm to the other arm for a relatively low supply voltage at a rate at least equal to the rate with which the arms switch over for a supply voltage which is not as low.

15. A method of producing an output clock signal in a ring oscillator having a first inverter section, a delay circuit coupled to an output of the first inverter section, and a threshold amplifier coupled to an output of the delay circuit, the method comprising the steps of:

inverting an input clock signal using the first inverter section;

delaying an output of the first inverter section in the delay circuit to produce a delayed output;

inverting the delayed output in an inverter stage of the threshold amplifier to produce an inverted delayed output;

setting, by setting means included in the threshold amplifier and coupled to the output of the inverter stage, a frequency for the step of inverting the delayed output by setting a first threshold voltage during a voltage rise of the delayed output and setting a second threshold voltage during a voltage fall of the delayed output;

reducing a difference between the first and second threshold voltages during a supply voltage drop by reducing means included in the threshold amplifier and coupled to the setting means; and inverting the inverted delayed output.

16. A method according to claim 15, wherein the step of reducing the difference between the first and second threshold voltages provides a stable frequency at a predetermined voltage supply range while producing a frequency at relatively lower voltage supply which is at least equal to the frequency at relatively higher voltage supply.

17. A method according to claim 15, herein the step of reducing the difference between the first and second threshold voltages includes a step of increasing a ratio of a voltage drop threshold to a level of the supply voltage and decreasing a ratio of a voltage rise threshold to the level of the supply voltage when the level of the supply voltage drops.

* * * * *